United States Patent [19]

Puckette

[11] 4,352,210
[45] Sep. 28, 1982

[54] LINEAR MIXER WITH REDUCED SPURIOUS RESPONSES

[75] Inventor: Charles M. Puckette, Scotia, N.Y.

[73] Assignee: General Electric Company, Schenectady, N.Y.

[21] Appl. No.: 186,686

[22] Filed: Sep. 12, 1980

[51] Int. Cl.³ .......................... H04B 1/26; H04B 1/10
[52] U.S. Cl. ................................... 455/317; 455/318; 455/324; 328/165; 307/527; 307/529
[58] Field of Search .............. 455/313, 317, 318, 319, 455/323, 324; 329/50, 105, 107, 174; 328/15, 16, 18, 165; 307/525, 527, 529; 370/70

[56] References Cited

U.S. PATENT DOCUMENTS 3,525,941  8/1970  Smith .................................. 455/323
3,628,154 12/1971  Weill .................................. 455/313

Primary Examiner—Jin F. Ng
Attorney, Agent, or Firm—Geoffrey H. Krauss; James C. Davis, Jr.; Marvin Snyder

[57] ABSTRACT

A linear mixer, having essentially no spurious responses below the fifth harmonic of a local oscillator frequency, utilizes a balanced demodulator summation network having first and second inputs each receiving an RF input signal via an associated one of a pair of switches operated at the local oscillator frequency. The local oscillator waveform is selected to eliminate the third harmonic thereof, whereby a baseband signal output of the summation network is a signal having essentially zero magnitude responses at at least the second, third, fourth and sixth harmonics of the oscillator frequency. Digital circuitry to provide the required oscillator waveform is disclosed.

9 Claims, 4 Drawing Figures

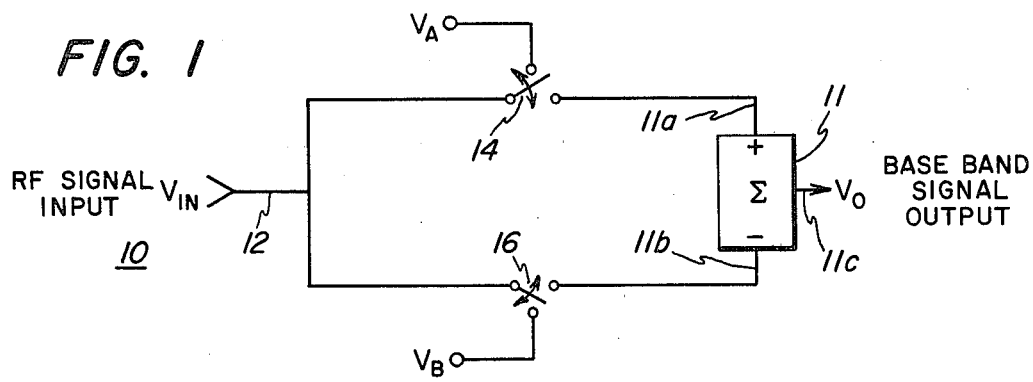
FIG. 1
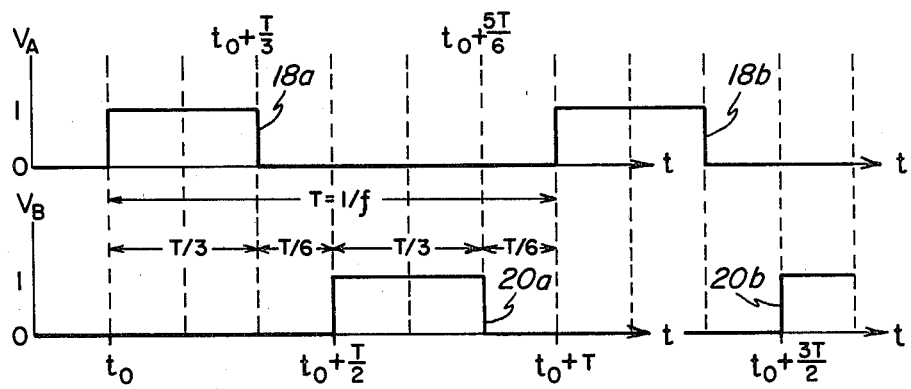
FIG. 2a
FIG. 2b
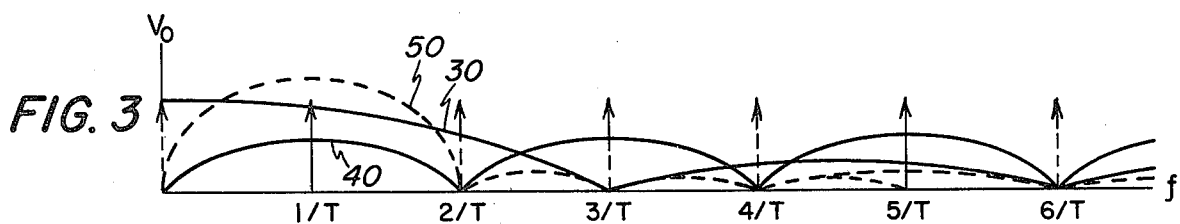
FIG. 3
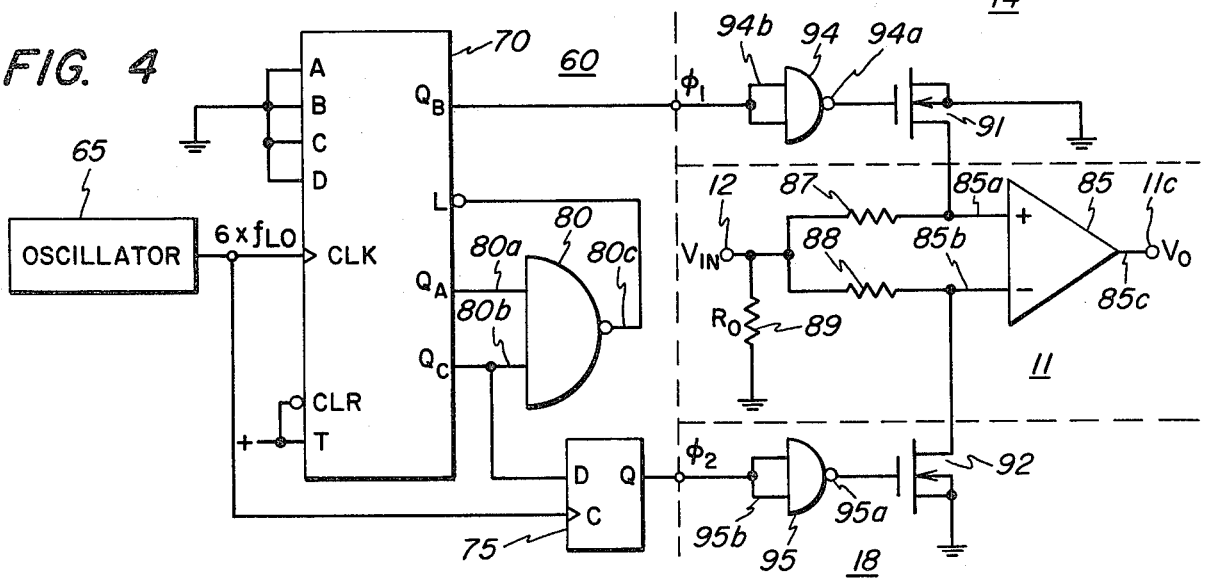
FIG. 4

LINEAR MIXER WITH REDUCED SPURIOUS RESPONSES

BACKGROUND OF THE INVENTION

The present invention concerns frequency-conversion mixers and, more particularly, a novel linear mixer having reduced spurious responses.

It is known that frequency conversion of an input RF signal to a baseband output signal, by mixing the RF signal with a local oscillator (LO) waveform frequency, often generates spurious responses, and particularly those spurious responses related to multiples of the LO frequency. Such spurious responses are generally undesirable. For example, in an ultrasonic scanning system requiring an input bandwidth typically on the order of 1.2 MHz. to 6 MHz., the realized amplifier response is determined by the bandwidth of the integrated circuit amplifier stages utilized to obtain a required gain, and is on the order of 1-10 MHz. It is therefore possible for receiver thermal noise at the third harmonic of the signal frequency to be folded down to baseband and add with the desired signal, thusly degrading the output receiver signal-to-noise ratio. While some thermal noise protection may be provided by utilizing a bandpass filter between a wideband input amplifier and a subsequent demodulator, the output of the amplifier appears, under high gain conditions, as the sum of wideband thermal noise plus the desired signal. If a balanced demodulator, such as a Motorola MC1496 integrated circuit balanced demodulator, is used, the demodulator conversion efficiency will have decreased by only 10-14 dB. at the local oscillator third harmonic frequency, with respect to the conversion efficiency thereof at the fundamental frequency. If the desired signal has a 1MHz bandwidth, at a center frequency of about 2.5 MHz. (with an identical local oscillator frequency for conversion to baseband), the signal center frequency and local oscillator frequency third harmonics are at 6.75 MHz. and are well within the noise generation response range of the input wideband amplifier. Therefore, any noise at the third harmonic of the local oscillator frequency will also be translated down to baseband and reduce the system signal-to-noise ratio. Further, because a third-harmonic-rejecting bandpass filter must therefore be used such in such a receiver, if a multi-channel receiver is to be realized, that receiver must be rendered inoperative for some period of time while filters are changed when the system operating frequency is to be changed. It is therefore highly desirable that such a receiving system be able to operate at different frequencies without the necessity for making extensive changes and adjustments to the elements thereof.

While it is known that a third oscillator frequency harmonic problem can be eliminated by utilizing a sinusoidal LO waveform with a true multiplication circuit, such true-multiplication circuits are not currently available at required frequencies. Further, if the local oscillator waveform is digitally derived, that waveform is a two level waveform which would also generate third harmonic degradation of the signal-to-noise ratio even if a true multiplication circuit were to be used. Accordingly, a linear mixer driven by a local oscillator logic waveform and having an essentially zero magnitude response at at least the third harmonic of the local oscillator frequency is highly desirable.

BRIEF SUMMARY OF THE INVENTION

In accordance with the invention, a linear mixer having reduced spurious responses utilizes a balanced demodulator summation network having a signal output equal to the difference in instantaneous amplitude of signals at first and second inputs thereof. Each of the first and second inputs receives an RF input signal through an associated switch means, operated by drive waveforms at the local oscillator frequency. Each switch is closed for only one-third of a local oscillator cycle, with the pair of switch-driving waveforms being offset from each other by one-half the time-interval for one cycle of the local oscillator waveform. The differential balanced demodulator network provides essentially zero output response magnitudes at even harmonics of the oscillator frequency (which is, for a baseband output, at the RF input signal frequency), while the local oscillator waveform surpresses all 3 N multiplies, with N=1, 2, 3 . . . , of the oscillator frequency in the mixer baseband signal output.

In one presently preferred embodiment, the balanced demodulator network is a differential video amplifier receiving the input RF signal at its inverting and non-inverting inputs via an associated one of a pair of resistance elements. A switching field-effect transistor is connected from each input to ground potential. Each of these switching devices is driven by a different one of the oppositely-phased local oscillator waveforms. The local oscillator drive waveforms are obtained from digital circuitry driven by an oscillator operating at six times the desired local oscillator frequency.

Accordingly, it is an object of the present invention to provide a novel linear mixer having reduced spurious outputs at at least a third harmonic of the local oscillator frequency.

This and other objects of the present invention will become apparent upon consideration of the following detailed description when read in conjunction with the drawings.

BRIEF DESCRIPTION OF THE DRAWINGS

FIG. 1 is a schematic block diagram of a novel reduced-spurious-response linear mixer in accordance with the principles of the present invention;

FIGS. 2a and 2b are coordinated graphs illustrating the local oscillator waveforms applied to the mixer of FIG. 1;

FIG. 3 is a graphical illustrations of the output frequency spectrum for the mixer of FIG. 1; and FIG. 4 is a schematic diagram of one presently preferred embodiment of the reduced-spurious-response mixer of the present invention.

DETAILED DESCRIPTION OF THE INVENTION

Referring initially to FIG. 1, a linear, reduced-spurious-response mixer 10 utilizes a differential balanced demodulator summing means 11. Summing means 11 has a non-inverting input 11a, an inverting input 11b and an output 11c at which a signal appears responsive to the difference in signals at inputs 11a and 11b. RF signal input 12 is connected to one terminal of each of first and second switch means 14 and 16. The remaining terminal of each of switch means 14 and 16 is connected to an associated one of inputs 11a and 11b. Each of switch means 14 and 16 is operated between an open condition and a closed condition responsive to receipt of an associated one of binary logic levels of waveform signals $V_A$ and $V_B$, at a local oscillator frequency. The local oscillator frequency is essentially equal to the RF signal frequency, whereby modulator output 11c provides a baseband signal output.

Each of the digital local oscillator waveforms $V_A$ and $V_B$ are as shown in FIGS. 2a and 2b. Each waveform is periodic with a period T, equal to the reciprocal of the local oscillator frequency f. Each of the pair of oscillator waveforms are shifted by one-half of the oscillator period with respect to the other of the oscillator waveforms; each waveform is at a first logic level (e.g. the logic one level) for only one-third of the total local oscillator interval T and is at a remaining logic level (e.g. the logic zero level) for the remaining two-thirds of the local oscillator time interval T. Thus, immediately prior to the start of a local oscillator waveform cycle, for example at time $t_0$, both the first and second local oscillator switch-driving waveforms $V_A$ and $V_B$ are at a logic zero level. At time $t_0$, one of the waveforms, e.g. waveform $V_A$, rises to the logic one level, while the remaining waveform, e.g. waveform, $V_B$, remains at the logic zero level. Waveform $V_A$ remains at the logic one level for a time interval T/3 equal to one-third of the total local oscillator time interval T. Thus, at time $(t_0+T/3)$, the $V_A$ waveform returns to the logic zero level and remains at such level until the end of the waveform time interval, at time $t_0+T$. The $V_B$ waveform remains at the logic zero level until a time half-way through the cycle, at time $t_0+T/2$, at which time the $V_B$ waveform rises to the logic one level. The $V_B$ waveform remains at the logic one level for one-third of the local oscillator time interval, and reverts to a logic zero level thereafter, at time $t_0+5T/6$. The pair of local oscillator waveforms repeat in the next local oscillator time interval starting at time $t_0+T$, and for each LO time interval thereafter.

Utilizing Woodward's notation, the mixer output signal x(t), in the time domain, can be represented in terms of the input signal s(t), as:

$$x(t) = s(t) \times \text{Rep}_T[\text{Rec}t\ (t/p)] - s(t) \times \text{Rep}_T \quad (1)$$
$$[\text{Rec}t\ (t - (T/2)/p]$$

where T is, as previously mentioned, the reciprocal of the local oscillator frequency and p is the local oscillator pulse width, herein set equal to T/3. Transforming equation 1 into the frequency domain;

$$X(f) = S(f)*(1/T)\text{comb}\ 1/T\ [p\ \text{sinc}\ pf] - S(f)*(1/T)\text{comb}\ 1/T \quad (2)$$
$$[e^{-j2\pi fT/2}\ p\ \text{sinc}\ pf]$$

where * denotes convolution. Rearranging terms in equation 2:

$$X(f) = \left(\frac{p}{T}\right) S(f)*\text{comb}\ 1/T(1 - e^{-j\pi fT})\ \text{sinc}\ pf]. \quad (3)$$

The term on the right hand side of the convolution operation in equation 3, is of major importance, as this term is the frequency spectrum of the mixing signal. The argument within the comb function represents the filtering function for the line spectrum, i.e. those discrete frequencies located at harmonics of (1/T), and represents the elimination of the third harmonic of the local oscillator frequency from the mixing process.

FIG. 3 illustrates the frequency spectra resulting when p=T/3; the first zero crossing of the sinc function 30 is forced to occur at 3/T, with subsequent zero crossings of the sine function occuring at 6/T,9/T . . . , i.e. at 3N/T, with N=1,2,3 . . . ; these frequency components are effectively removed from the mixer output spectrum. In addition, by driving both inputs of a balanced demodulator with the same RF input signal, all even multiples thereof, which occur at even multiples of the local oscillator frequency in a baseband output mixer, have essentially zero magnitude in the associated $V_O$ waveform portion 40. Thus, frequency components at 2N/T, where N=0,1,2,3 . . . are of essentially zero magnitude. It will be seen that the output waveform 50, being the convolution of waveforms 30 and 40, has essentially zero amplitude components at the second, third, fourth and sixth harmonic of the local oscillator frequency, respectively at f=2/T, 3/T, 4/T and 6/T. The first non-zero harmonic response is at the fifth local oscillator harmonic, at f=5/T.

Referring now to FIG. 4, one presently preferred circuit 60 for obtaining the required oscillator waveform utilizes an oscillator 65 providing a periodic output waveform at six times the required LO frequency. The oscillator output signal is applied to the clock CLK input of a synchronous four-bit counter 70, such as the TTL 74161 integrated circuit counter, and to the clock C input of a type D flip-flop logic element 75, such as in a portion of a TTL 7474 integrated circuit. The data inputs A, B, C and D of counter 70 are set to a logic zero level by connection to ground potential, while the clear CLR and enable T inputs are connected to positive operating potential. First counter stage output $Q_A$ is connected to one input 80a of a two-input NAND gate 80, such as found in a portion of a TTL 7400 integrated circuit. The remaining gate input 80b is connected to third counter stage output $Q_C$, as is the data D input of flip-flop logic element 75. The gate output 80c is connected to the load L input of counter 70.

In operation, the clock CLK signal operates counter 70 at six times the local oscillator frequency and the counter output states change every one-sixth of the required local oscillator time interval T. Gate output 80c falls to a logic zero level at the time of the fifth such change and provides a logic zero signal to the load L input thereby enabling the parallel load function of the counter, and loading a zero count therein, after the next, i.e. the sixth, cycle of the input oscillator waveform as a result of the ABCD inputs being at the logic zero level. After the counter is set to a zero count, the output of gate 80 goes to a logic 1 level thereby inactivating the parallel load function of the counter 70. The counter therefore goes to a count of "one" for the seventh oscillator cycle, etc. Accordingly, the second counter stage $Q_B$ output waveform (the $\phi$, output) is at a logic one level during the second and third cycles of each group of six oscillator cycles and is at a logic zero waveform for the next four oscillator cycles thereafter in each group; this sequence is repeated for every six oscillator cycle group thereafter. The Q output of flip-flop logic element 75 is at a logic zero level whenever the $Q_C$ third counter stage output is at a logic zero level, which occurs for the first three oscillator cycles. The $Q_C$ output rises to a logic one level at the fourth oscillator cycle 75 and stays at the logic one level until counter 70 is reloaded to a zero count. The Q output of flip-flop logic element does not, because of propagation delays in counter 70, receive the φ logic one level at the data D input thereof until after the rising edge of the fourth oscillator cycle and therefore does not clock the output to the logic one level until the fifth oscillator cycle. Therefore, the waveform at the Q output of element 75 (the $\phi_2$ output) is at a logic zero level for the first four oscillator cycles of each sequence and rises to a logic one level for the next two cycles thereafter, before reverting to the logic zero level at the end of the sixth oscillator cycle time interval, as counter 70 is reset. Thus, circuit 60 provides a pair of waveforms, starting at time t' (of FIGS. 2a and 2b) which are each at the logic one level for one-third of the total time interval and have a complementary phase relationship.

Balanced demodulator means 11 is provided by a differential amplifier 85, such as the type 733 differential amplifier analog integrated circuit. The differential amplifier has a non-inverting input 85a connected to the RF signal input 12 through a first resistance element 87, and has an inverting input 85b also connected to input 12 by another resistance element 88, of the same resistance value as element 87. A resistance element 89, of magnitude $R_o$, is in shunt from input 12 to ground, as a terminating resistance for the input signal. Switches 14 and 16 are respectively provided by first and second field-effect transistors 91 and 92, preferably of the VMOS type, having their source-drain circuits connected between the associated one of inputs 85a and 85b and ground potential. The gate electrode of each of field-effect transistors 91 and 92 is connected to the associated output 94a or 95a of one of the pair of logic inverters 94 and 95, each having an input 94b or 95b respectively connected to the $\phi_1$ input (taken from the $Q_B$ output of counter 70) or the $\phi_2$ input (taken from the Q output of element 75). The mixer output 11c is connected to the output 85c of differential amplifier 85.

In operation, when both of field-effect transistance 91 and 92 are in the off condition, responsive to the $\phi_1$ and $\phi_2$ waveforms being a a logic zero level, the input RF input signal voltage $V_{in}$ at input 12 is provided equally to be inverting and non-inverting inputs 85a and 85b of differential amplifier 85. The differential amplifier has a common mode rejection which causes the equal-amplitude inputs to cancel at the output. When the logic one level at input $\phi_1$ turns on the associated field-effect transistor 91, the non-inverting input 85a of the differential amplifiers is grounded through a relatively small switching transistor controlled-circuit resistance, on the order of 2-2 ohms, and, as resistances 87 is much larger through the FET on-resistance, the non-inverting input receives substantially none of the input RF signal, whereby the output of the differential amplifier respond only to the signal at inverting input 85b and the mixer output voltage $V_O$ is an inverted version of the input RF voltage $V_{in}$. Conversely, when the $\phi_2$ waveform attains a logic one level and turns on the associated field-effect transistor 92, the inverting input 85b is connected to ground potential through a similar small resistance, in the controlled circuit of transistor 92. Resistance 88 is much larger than the FET on-resistance. The signal at the output of the differential amplifier is now a non-inverted version of the input signal at the non-inverting input 85a thereof. Therefore, the output frequency spectrum of FIG. 3 is realized.

While one presently preferred embodiment of my novel linear mixer with reduced spurious outputs is described in detail herein, many modifications and variations will now become apparent to those skilled in the art. For example, switch means 14 and 16 may be realized with any form of mechanical, electromechanical or electronic apparatus capable of operating between open and closed conditions at the required LO frequency. It is my intent, therefore, to be limited only by the scope of the appending claims and not by the specific details and instrumentalities described herein.

What is claimed is:

1. A reduced-spurious-response mixer circuit comprising:
   an input terminal receiving an input signal;
   an output terminal;
   a balanced differential summing network having an inverting input, a non-inverting input and an output connected to said output terminal;
   first and second switch means for selectively coupling said input signal from said input terminal respectively to said summing network inverting and non-inverting inputs responsive respectively to first and second local oscillator signals; and
   means for providing said first and second local oscillator signals as digital waveforms each having first binary values for one-third of a time interval equal to the reciprocal of the local oscillator frequency, and having a second binary value at all other times, said first and second signals being offset from one another by a time interval equal to one-half the local-oscillator time interval, to cause the third harmonic of said local oscillator frequency to have an essentially zero magnitude in a waveform resulting at said output terminal.

2. The circuit of claim 1, wherein the input and local oscillator frequencies are essentially identical, and said output terminal waveform is a baseband signal output.

3. The circuit of claim 2, wherein said output terminal waveform also has an essentially zero magnitude response at even harmonics of said local oscillator frequency.

4. The circuit of claim 1, wherein said first and second switch means each include a resistance element connected between said input terminal and an associated one of said summing network inverting and non-inverting inputs; and first and second switching devices each having a controlled-resistance circuit connected between ground potential and an associated one of said summing network inverting and non-inverting inputs, each switching device resistance circuit switching from a first to a second magnitude responsive respectively to an associated one of said first and second local oscillator signals being respectively at said first and second binary values.

5. The circuit of claim 4, wherein each device is a field-effect transistor having a gate electrode, a source electrode and a drain electrode; one of the source and drain electrodes of each device being connected to ground potential and the remaining one of the source and drain electrodes of each field-effect transistor being connected to the associated one of said summing network inverting and non-inverting inputs; the gate electrode of each said transistor receiving one of said first and second local oscillator signals.

6. The circuit of claim 5, wherein each of said first and second switch means further comprises a logic inverter having an output connected to the gate electrode of the associated one of said first and second switching devices and an input receiving an associated one of said first and second local oscillator signals.

7. The circuit of claim 1, wherein said summing network includes a differential video amplifier.

8. The circuit of claim 1, further comprising a resistance element connected at said input terminal for providing a characteristic terminating impedance to said input signal.

9. The circuit of claim 1, wherein said oscillator signal providing means comprises: oscillator means for providing a logic waveform having a frequency equal to six times the local oscillator frequency; a synchronous counter having a clock input receiving the output waveform of said oscillator means, at least three synchronous binary-counting stages each having an output, and a load input for resetting the logic level at each of said at least three counting stage outputs to said second binary value; a NAND gate having a first input connected to the first counting state output, a second input connected to the third counting stage output, and an output connected to said load input; said first local oscillator signal being provided at said counter second counting stage output; and a type-D flip-flop logic element having a clock input receiving the output waveform of said oscillator means, a data input connected to the third counting stage output of said counter, and an output providing said second local oscillator signal.

* * * * *